United States Patent [19]
Bolotin et al.

[11] Patent Number: 5,790,567
[45] Date of Patent: Aug. 4, 1998

[54] PARALLEL PROCESSING SPACECRAFT COMMUNICATION SYSTEM

[75] Inventors: Gary S. Bolotin, Moneovia; James A. Donaldson, Glendale; Huy H. Luong, Alhambra; Steven H. Wood, Los Angeles, all of Calif.

[73] Assignee: California Institute of Technology, Pasadena, Calif.

[21] Appl. No.: 519,786

[22] Filed: Aug. 28, 1995

[51] Int. Cl.$^6$ .................. H03M 13/00; H04B 7/204; H04B 7/185; H04J 3/24
[52] U.S. Cl. .................. 371/37.01; 370/341; 370/342; 370/349
[58] Field of Search .................. 371/37.1, 37.01, 371/37.02; 370/242, 341, 342, 347, 349

[56] References Cited

U.S. PATENT DOCUMENTS

| | | | |
|---|---|---|---|
| Re. 35,414 | 12/1996 | Murakami et al. | 348/416 |
| 4,145,573 | 3/1979 | Arnold | 370/323 |
| 4,205,324 | 5/1980 | Patel | 371/50.1 |
| 4,485,470 | 11/1984 | Reali | 370/537 |
| 4,665,532 | 5/1987 | Fukuda et al. | 375/292 |
| 4,979,174 | 12/1990 | Cheng et al. | 371/41 |
| 4,990,924 | 2/1991 | McMullen et al. | 342/359 |
| 5,022,051 | 6/1991 | Crandall et al. | 375/292 |
| 5,140,611 | 8/1992 | Jones et al. | 375/219 |
| 5,239,543 | 8/1993 | Janssens | 370/458 |
| 5,274,634 | 12/1993 | Babiarz | 370/422 |
| 5,410,568 | 4/1995 | Schilling | 370/342 |
| 5,513,191 | 4/1996 | Takechi et al. | 371/37.1 |
| 5,537,414 | 7/1996 | Takiyasu et al. | 370/347 |
| 5,550,831 | 8/1996 | Tanahashi | 370/321 |

*Primary Examiner*—Paul P. Gordon
*Assistant Examiner*—Robert J. Dolan
*Attorney, Agent, or Firm*—Fish & Richardson P.C.

[57] ABSTRACT

An uplink controlling assembly speeds data processing using a special parallel codeblock technique. A correct start sequence initiates processing of a frame. Two possible start sequences can be used; and the one which is used determines whether data polarity is inverted or non-inverted. Processing continues until uncorrectable errors are found. The frame ends by intentionally sending a block with an uncorrectable error. Each of the codeblocks in the frame has a channel ID. Each channel ID can be separately processed in parallel. This obviates the problem of waiting for error correction processing. If that channel number is zero, however, it indicates that the frame of data represents a critical command only. That data is handled in a special way, independent of the software. Otherwise, the processed data further handled using special double buffering techniques to avoid problems from overrun. When overrun does occur, the system takes action to lose only the oldest data.

19 Claims, 10 Drawing Sheets

PARALLEL PROCESSING SPACECRAFT COMMUNICATION SYSTEM

Statement as to Federally Sponsored Research

The invention described herein was made in the performance of work under a NASA contract, and is subject to the provisions of Public Law 96-517 (35 USC 202) in which the Contractor has elected to retain title.

FIELD OF THE INVENTION

This invention describes an assembly for improving speed and accuracy of communications in a satellite uplink system.

BACKGROUND AND SUMMARY

Size, weight and power requirements are important when designing a spacecraft. Heavier payloads are more expensive to launch. Package size is also important, since spacecraft size is proportional to its weight.

One of the important functions carried out by such a satellite system is called uplink communications. Signals are transmitted from a ground station up the "link" to the satellite. These signals represent all useful functions that can be carried out with the satellite. The signals include control functions of the satellite as well as communication to or via the satellite. This communication is carried out using any well-known format. Previously, the communication was carried out using a number of chip sets to receive and buffer the information appropriately. These chip sets used a lot of power, and even with so much power being used, still was slow and space-inefficient.

It is an object of the present invention to form a system which carries out these functions in an improved way.

One aspect of the present invention receives and decodes uplink commands and also carries out various other functions, including determining direct-to hardware commands, and interface functions with the programmable read-only memory. The inventors of the present invention recognized that combining these functions in the same device produces some economies since there is certain coupling between various functions.

Another aspect uses a special data format and parallel processing algorithm to determine start sequences in uplink information. This system also carries out error detection and correction within a decoding block. This parallel processing technique is facilitated by the special data format used according to the present invention.

Another aspect uses a special and unique double-buffering method to maintain read/write status and to resolve over-run between the incoming data and the data which can be processed.

Yet another aspect provides a mechanism for allowing critical functions to be carried out using a technique which bypasses the usual software interpretation of commands.

Yet another aspect uses a special technique to determine errors, and that same technique to end a portion of a message.

BRIEF DESCRIPTION OF THE DRAWING

These and other aspects of the invention will now be described in detail with reference to the accompanying drawings, wherein.

DESCRIPTION OF THE PREFERRED EMBODIMENTS

Figure 1:
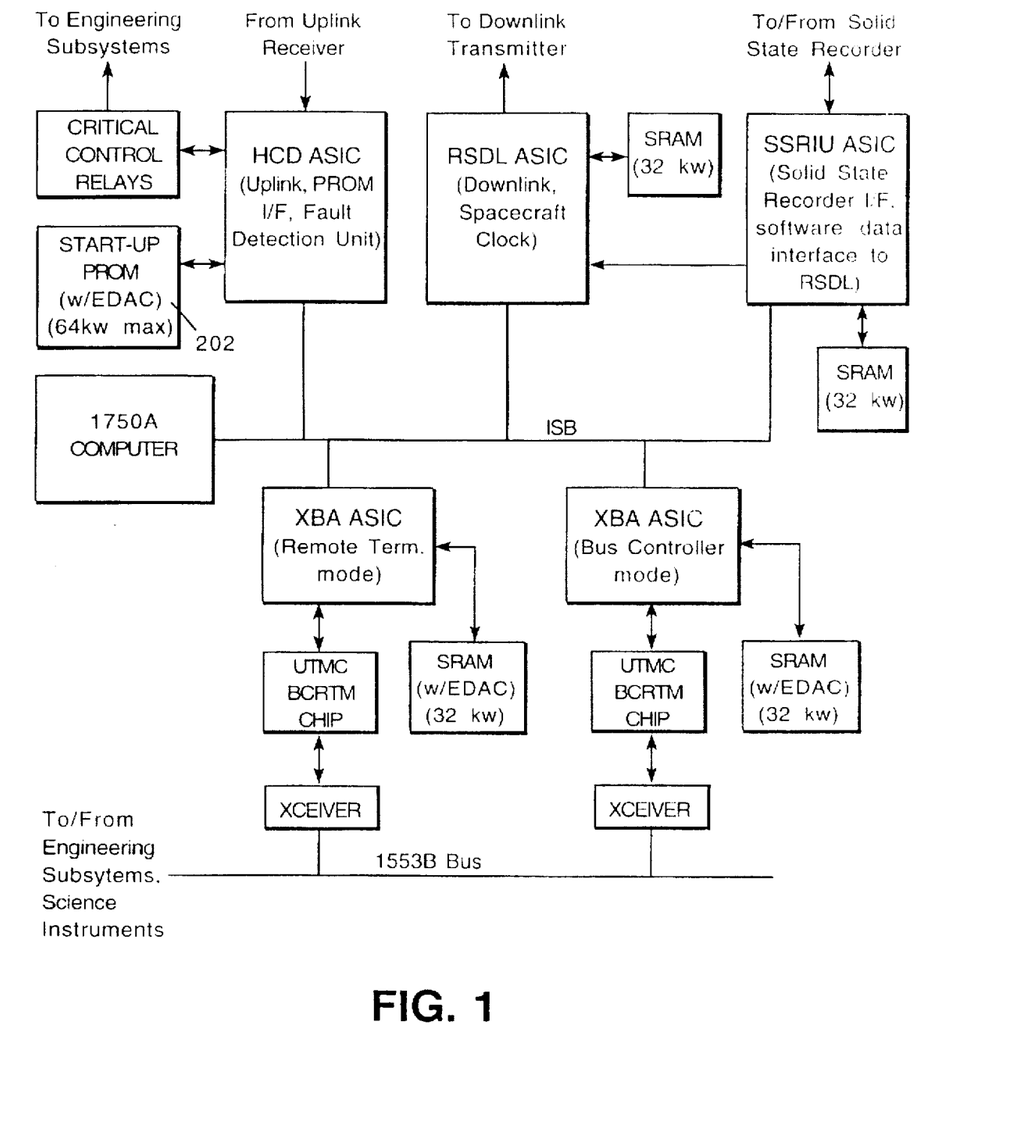
FIG. 1 is a block diagram of a command and data subsystem utilizing an assembly according to one aspect of this invention.

FIG. 1 shows a block diagram of the command and data subsystem of the present invention to decode uplink commands sent from the ground station to the space vehicle on which the device is installed.

A flight computer 10 controls associated devices over subassembly bus 12. The computer is preferably a 1750A low-power computer but any other similar computer which is suitable for space installation can be used.

The satellite controls a number of controlled functions. Many of these controlled functions are under the control of the critical control relay assembly 200. Control relays 200 include a plurality of latching-type relays. These relays are highly noise immune, and are very reliable. The control relays 200 are used, for instance, to control the payload, or in other circumstances where high reliability is necessary.

Control relays 200 are controlled by a hardware command decoder module 14. This module 14 is one of the described systems according to the present invention. Module 14 carries out uplink processing, interface with the program-storing programmable read only memory ("PROM"), and fault detection. The techniques of operation described herein allow all of these functions to be combined into a single 256 pin chip. The way in which this is carried out is described herein.

The assembly starts up from a start-up memory, here PROM 202. The PROM 202 includes the error detection and correction program and assembly therein. This system can use any well-known error detection and correction system.

The inventors recognized that one of the speed and power drains in the prior art has the processing and operation time necessary to carry out the error correction and detection. It has sometimes taken as long as 64 clock cycles to process the uplink data. Accordingly, the speed of uplink data has been limited by the processing time for the error correction.

The present invention carries out a number of operations to avoid this problem. The present invention teaches that the data is arranged into a plurality of transfer frames within each uplink message unit. Each of the transfer frames represents one code block that can be independently decoded. Each transfer frame includes a channel number. Each of the channel-numbered code blocks is applied, in parallel, to one of a plurality of decoders. Therefore, the transfer code blocks are decoded in parallel by a plurality of decoders; each decoded while another one of the code blocks is being decoded. Essentially, therefore, these bits are clocked in, serial-to-parallel converted, and processed in parallel. The unique transmission protocol enables this parallel clocking as described above. Since the 64 units are processed in parallel, the speed of the communication is not limited by hardware.

Various other communications are also controlled by other associated hardware, which will described herein for completeness. The Reed-Solomon downlink assembly 204 controls downlink coding using the Reed-Solomon protocol. Solid state RIU chip 208 forms an interface to the Reed-Solomon downlink. A remote terminal mode interface 214 allows operation as a remote terminal, while a bus controller 216 allows operation as a bus controller.

Figure 2:
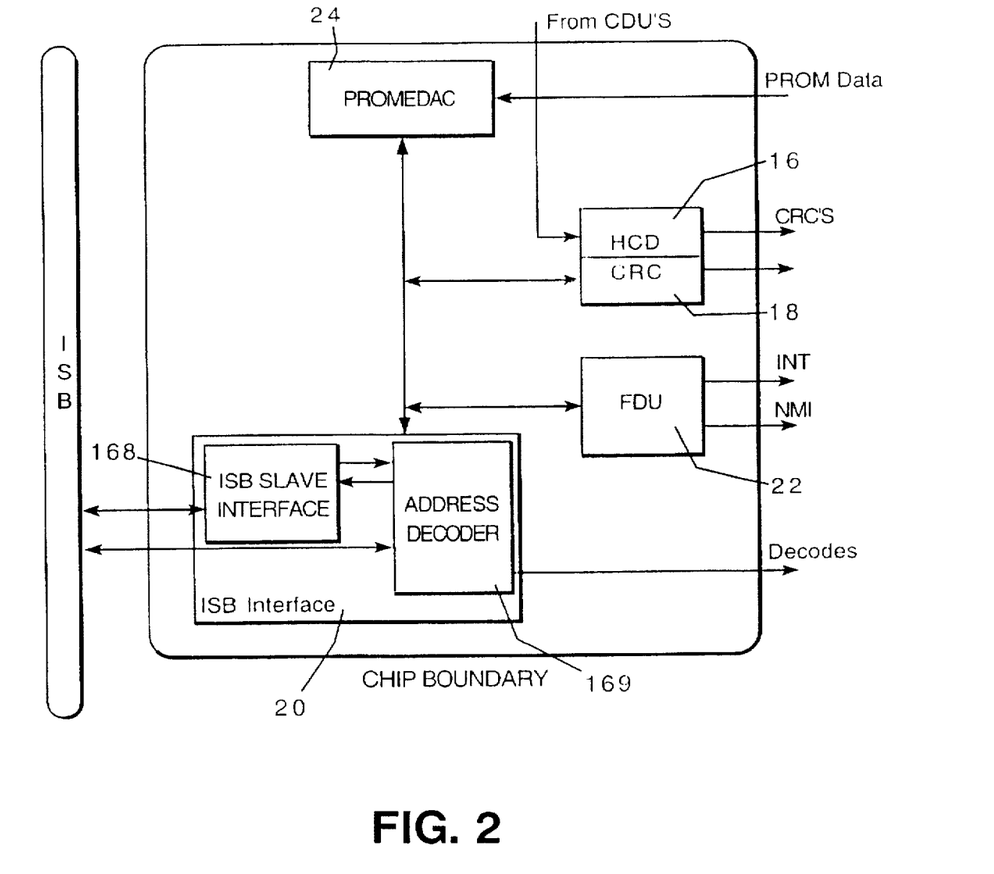
FIG. 2 is a functional block diagram of the assembly.

FIG. 2 shows a block diagram of the hardware command decoder 14 which is the main subject of this invention. The command decoder 14 communicates with the intersubassembly bus 12, as shown therein. The data received from the uplink has previously been communicated to the bus according to any known technique. The way in which the operation is carried out is described herein.

Intersubassembly bus interface 20 includes a slave interface 168 and an address decoder 169.

Data from PROM 202 is received at PROM EDAC 24. Unit 24 includes the error data and correction unit which checks the data for errors, and corrects any data that has errors therein.

A number of different kinds of commands and information can be passed from the uplink to the command decoder. A particularly important kind of command is called a critical enable. The critical enable controls a relay in the critical control relay assembly 200. One example of such a critical enable would be, for example, a command to deliver the payload.

The preferred technique of the present invention reserves the channel number 0 to indicate that the command block includes critical commands or critical enables. The critical controller 18 determines if a critical enable is contained within the uplink data. If a critical enable is contained in the received data, the hardware command decoder 16 decodes the critical enable and outputs a signal, via relay control 631, to control the states of critical control relays 200. These, then, control the engineering subsystems. The assembly 14 can support direct ground control of up to 32 relays and 24 discrete outputs.

The operation for processing a critical enable according to the present invention bypasses the usual software decoding. Each signal according to the present invention is associated with a channel. The channel can indicate the destination and/or time slot for the signal. According to the present invention, channel 0 is reserved for special operation. A signal that is labeled with channel 0 indicates that the data in that block is intended for a critical function. That channel command is virtual in the sense that it does not really indicate a channel; instead it indicates that no channel or channel decoding will be used.

If there is no critical enable contained in the data, the non-critical control relay data is passed to the inter subassembly bus interface 20. The data is buffered and addressed and passed to the main computer 10 over the inter subassembly bus 12 that includes intersubassembly slave assembly 168 and address decoder 169. A fault detection unit 22 periodically performs system checks as described herein to determine if the assembly 14 is operating properly.

A primary function of the assembly 14 is to decode uplink data received at an uplink receiver 8. The uplink error correction uses a well-known EDAC system as specified in the Consultive Committee for Space Data Systems (CCSDS) telecommand standard. The data has previously been formatted in accordance with the CCSDS TeleCommand standard, discussed herein with reference to FIGS. 3 and 3A.

Figure 3:
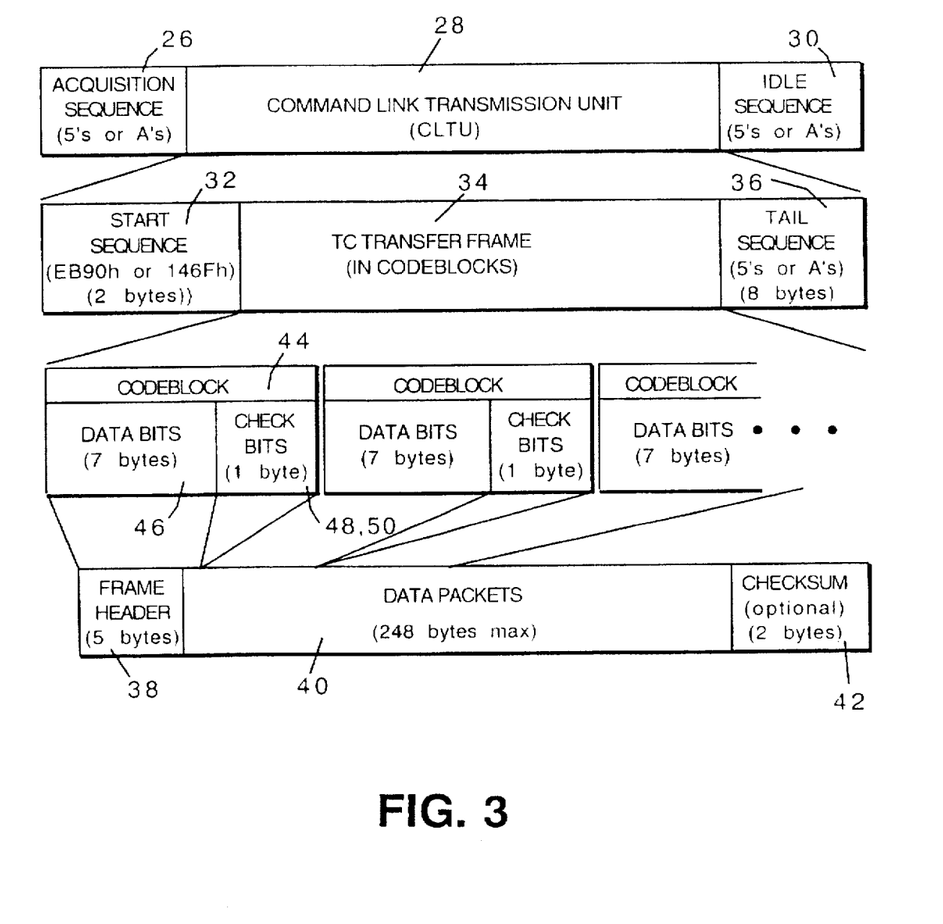
FIG. 3 is a diagram of the format of uplink data.
Figure 3A:
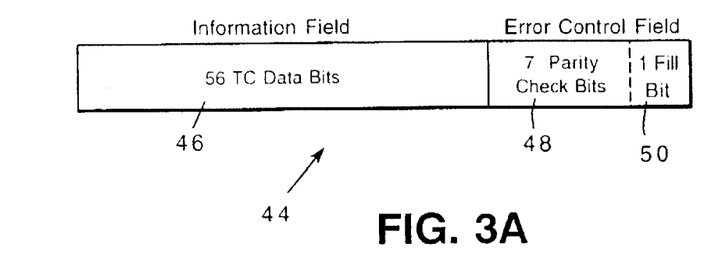
FIG. 3A is a diagram of the format of one code block of data.

The CCSDS-encoded uplink data stream shown in FIG. 3 includes three data structures: an acquisition sequence 26, a command link transmission unit 28 and an idle sequence 30. Acquisition sequence 26 is an alternating pattern of ones and zeros. Acquisition sequence 26 is used at the start of an uplink session to provide a sequence that allow the asynchronous uplink receiver to lock onto the data stream. The acquisition sequence is a minimum of two bytes in length,to allow proper acquisition.

The command link transmission unit 28 includes the actual data being sent to the spacecraft. Unit 28 has three parts: a start sequence 32, a transfer frame 34 and a tail sequence 36. Start sequence 32 preferably includes 16 bits of reserved information. That value is preferably EB90 hex if the data polarity is positive, and its complement 146F hex if the data polarity is negative. Start sequence 32 hence identifies the beginning of a command link transmission unit 28 and tells the system the polarity of the data.

A telecommand transfer frame 34 follows the start sequence 32. Each telecommand transfer frame 34 has a five byte frame header 38, a frame data field 40 formed of a plurality of code blocks which is a maximum of 248 bytes, and a two byte optional check-sum 42. Each telecommand transfer frame 34 is composed of several telecommand code blocks 44. The code black 44 has 56 information bits 46 (7 data bytes), 7 check bits 48 and one fill bit 50. See FIG. 3A. The check bits are generated using a modified Bose-Chaudhuri-Hocquenghem (BCH) code. This code is specified in the CCSDS telecommand standard and is well known to those of ordinary skill in the art.

The telecommand tail sequence 36 marks the end of the transfer frame. It has 64 bits with the reserved sequence value 5555 5555 5555 5555 hex if the data polarity is positive, and its complement AAAA AAAA AAAA AAAA if the data polarity is negative. The tail sequence 36 identifies the end of a command link transmission unit 28.

Idle sequence 30 marks the end of the complete package of data. Like the acquisition sequence 26, the idle sequence 30 is an alternating pattern of ones and zeros. It allows the uplink receiver to maintain a lock on the signal in the absence of actual data being transmitted.

The uplink data received by the assembly 14 may be inverted or non-inverted. If the assembly 14 determines that the start sequence 32 is 146F hex, the polarity of the data is judged to be negative and all subsequent data received will be inverted by the assembly 14 before being written into software buffers. If the assembly 14 determines that the start sequence 32 is EB90 hex, the polarity is judged to be positive and therefore no inversion is needed.

An additional layer of security is also available in the units. Start sequence 32, which can one of two reserved values as described above, can be used to determine the start of any command link transmission unit. However, certain commands, such as commands to the control relay, require enhanced security. According to this mode, an enhanced start sequence is preferably used to detect the start of an enhanced security command link transmission unit. The enhanced start sequence reduces an probability of the assembly 14 mistakenly detecting a command link within a stream of random data. This enhanced start sequence can be, for example, the initial start sequence 32 followed by an additional start sequence which must follow the start sequence 32. The probability of detection can be accordingly minimized.

Figure 4:
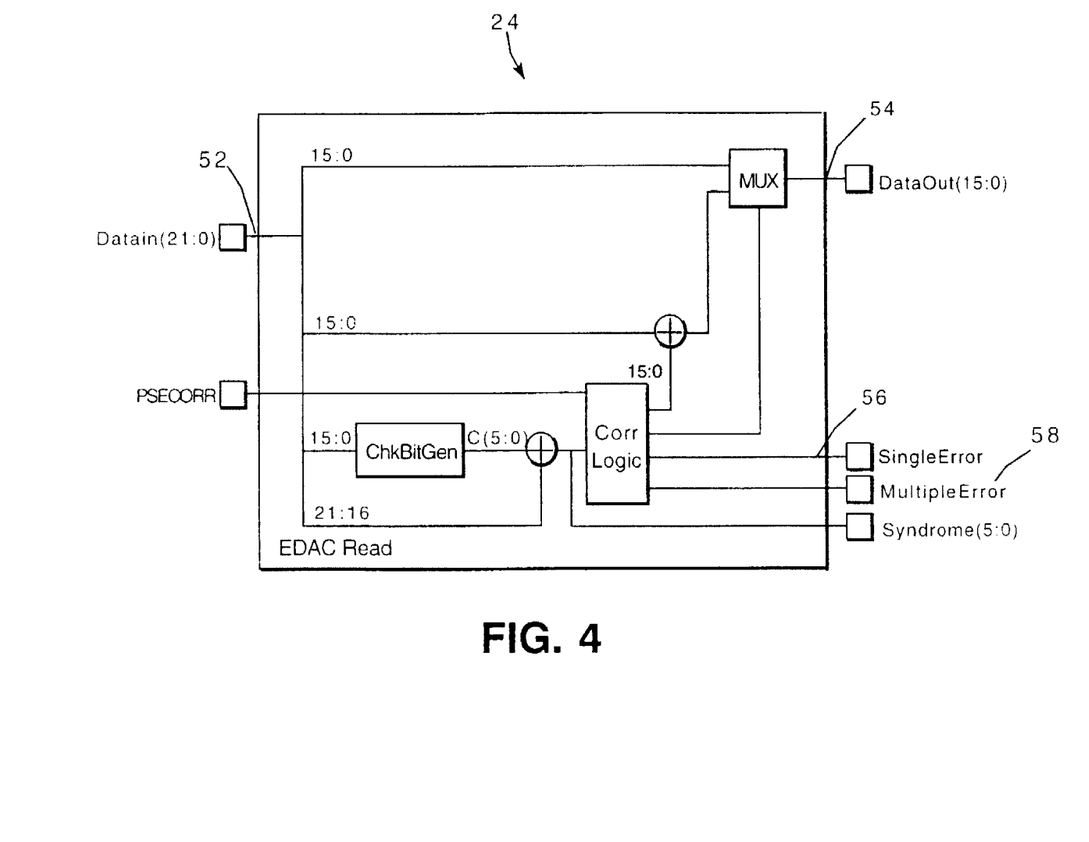
FIG. 4 is a functional diagram of an error detection and correction circuit.

FIG. 4 is a diagram of one of the error detection and correction units 24 that is included in the assembly 14 of FIG. 1. Preferably, 64 of these units are provided, so that the error correction and detection unit 24 provides error detection and correction functions on incoming data in parallel. The acquisition or start sequences is stripped from the data so that only the code blocks 44 are serially run through the error detection and correction logic of the error detection and correction unit 24.

Each code block 44 contains seven parity check bits 48, which allow error detection and correction to be performed on the code block 44. The error detection and correction unit 24 receives data on the DataIn port 52 and outputs corrected data on the DataOut port 54. The data correction is carried out in any known way, using any of the known data correction techniques which are described in the CCSDS telecommand standard. The system of FIG. 4 shows the correction logic, along with use of check bits and multiplexers to produce the data correction and detection.

The error detection and correction logic can operate in one of two user-selectable modes. In the first mode, single bit errors will be corrected and double bit errors can be detected but not corrected. They cause the error detection and correction unit to set a flag indicating that an uncorrectable error has occurred. In this mode, triple bit errors may not be detected at all. In the second mode, single, double or triple bit errors will be detected but there is no error correction. If the uplink channel is very noisy, the user might want triple bit error detection. If the uplink channel is not very noisy, the user might prefer to have double bit error detection and single bit error correction. Single bit error detection and correction allows the error detection and correction unit 24 to correct a single bit error through the use of correction logic and the inter subassembly bus 12 is notified of a correctable error through a correctable detected error signal 56. If, however, the error detection and correction unit 24 detects more than one error, the errors will not be corrected, and the inter subassembly bus 12 will be notified of an uncorrectable error 58 by forcing bad parity on the inter subassembly bus 12.

The mode can be software controlled, or can be controlled by uplink commands.

Figure 7:
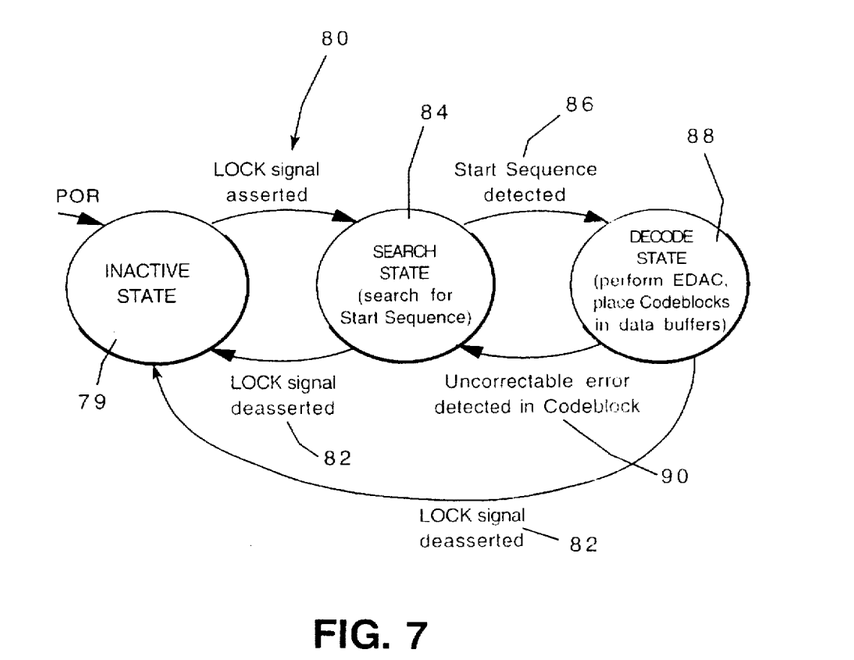
FIG. 7 is a flow diagram showing the reception of data.

The operation of detecting data is shown and explained with reference to the operational flow diagram of FIG. 7. The command decoder is idle at 79. A lock signal is received from the uplink receiver at step 80. The lock signal indicates that the input data to the command decoder is valid. Whenever the lock signal is de-asserted, the data is no longer valid, causing the command decoder to ignore the data. Once lock is asserted at step 80, however, the system enters a search state at step 84 to search for a start sequence in the uplink sequence. When a valid start sequence is detected at step 86, the hardware command decoder is commanded into a decoding state 88. Decoding state 88 initiates error correction and detection. Each code block is placed in a data buffer that is software accessible.

Any code block with an uncorrectable error causes the hardware command decoder to transition back to the search state 84 at step 90 to search for another start sequence.

The tail sequence that ends one of the units actually includes an uncorrectable error therein: 55555 55555 55555 hex. This produces a double-bit error. The hardware recognizes this double-bit error, and sets the uncorrectable error flag. Note that the fill bit in the tail sequence 36 is set to "1" and that the code blocks 44 have the fill bit set to "0". The acquisition sequence 26 also has the fill bit set to "1". A "1" in the fill bit position is required for detection of the tail sequence 36, and a "0" in the fill bit position is required for detection of a code block 44.

Figure 10:
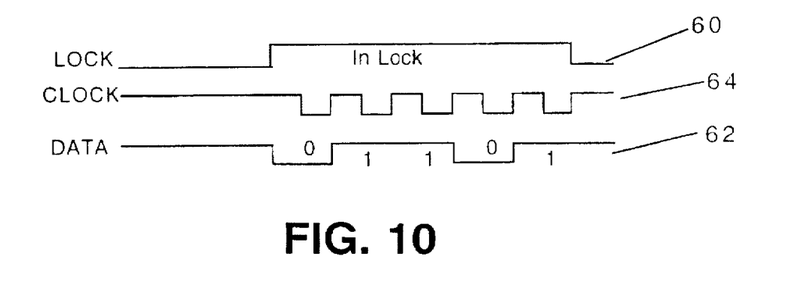
FIG. 10 is a diagram of signals received during uplink reception.

The uplink receiver interface is a serial, synchronous interface which receives data transmitted from an uplink station and passes it on to the DataIn port 52 of the error detection and correction unit. FIG. 10 illustrates three types of signals received by the uplink receiver. Lock signal 60 indicates if the uplink receiver is locked and producing valid data. The assembly 14 only decodes the uplink data 62 when the lock signal 60 is asserted and ignores uplink data 62 when the lock signal 60 is de-asserted. Clock signal 64 is used to clock in the uplink data 62. The assembly 14 can support an uplink data rate of up to 200,000 bits per second.

Figure 8:
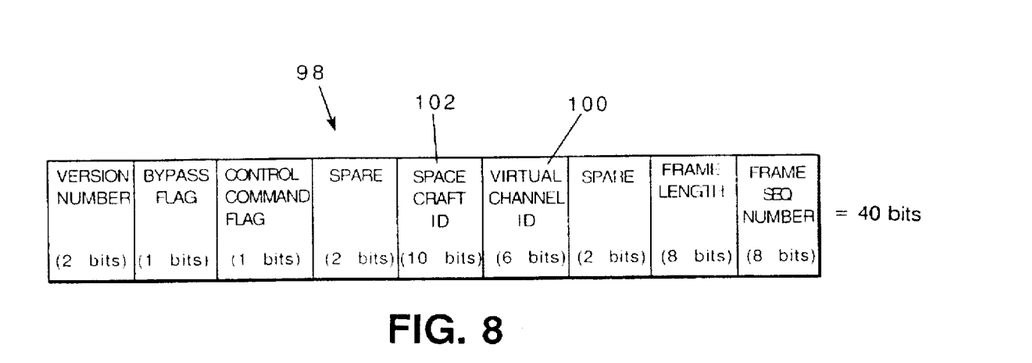
FIG. 8 is a block diagram of a frame header within any one code block.

The transfer frame header has the structure shown in FIG. 8. The information included in the transfer frame header is crucial for processing the actual information of the transfer frame. Virtual channel number 100 is specified in the transfer frame header. As described above, the virtual channel ID bits 100 are usually used to identify the transfer frame, and to allow it to be logically multiplexed from a single physical telecommand data channel 98 into 64 logical channels.

The assembly 14 imposes two restrictions on the use of these channels: (1) virtual channel 0 is reserved for hardware commands which toggle the critical enables independent of the software; and (2) when using virtual channel 0, the command link transmission unit 28 may contain only one transfer frame 34.

Once the assembly 14 detects a start sequence 32, it checks the virtual channel ID bits 100 in the frame header 38 in the first transfer frame 34. When a virtual channel 0 transfer frame is detected, the assembly 14 checks to determine if the spacecraft ID bits 102 in the frame header are correct. If they are correct, the assembly 14 writes the critical enables specified in the frame data field and places the code block in the data buffer.

When a non-virtual channel 0 transfer frame is detected, the assembly 14 simply places the code block 44 in the software data buffer without checking any of the other bits in the frame header 38. The critical enables described above control the hardware function independent of the software, and do so with a high measure of reliability.

The user can set the spacecraft ID via ten input pins on the assembly 14. Anywhere from one to eight critical enables can be set with a single transfer frame 34. However, as described above, only a single transfer frame can be included in the message.

The assembly 14 contains a mask bit for each critical enable. The mask bits are controlled from the ground via virtual channel 0 commands. The ground can allow flight software control of a critical enable via the mask bits.

Figure 6:
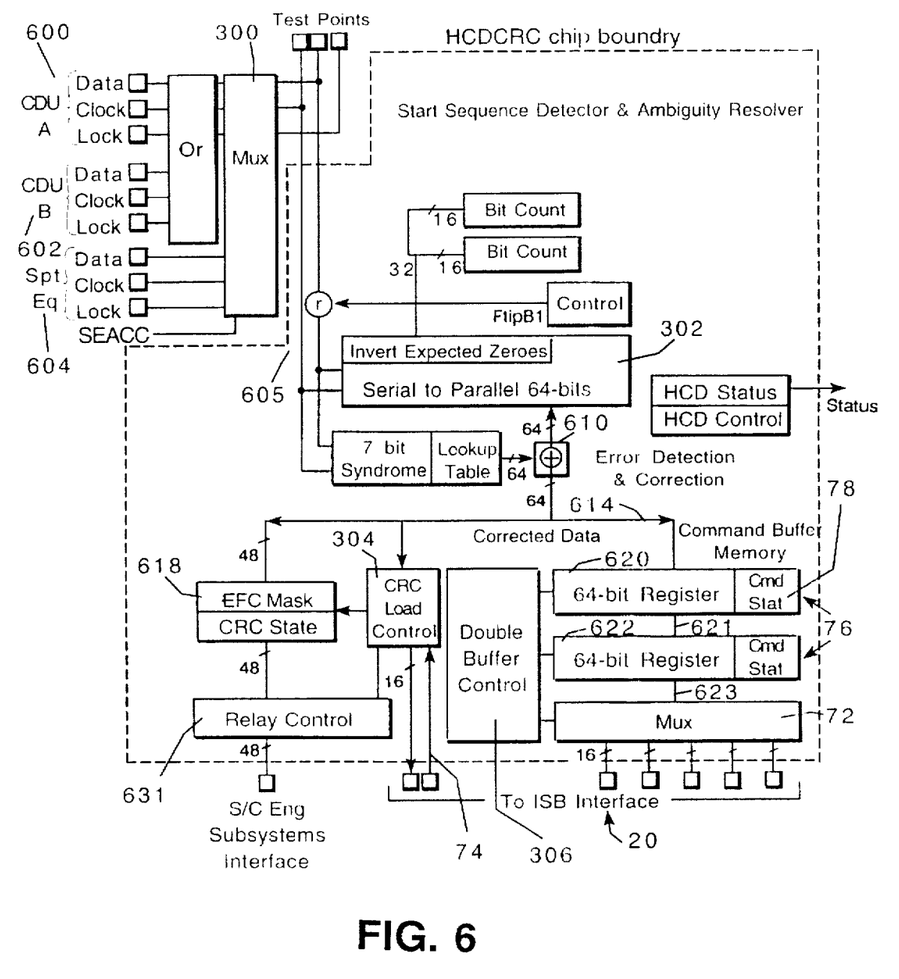
FIG. 6 is a block diagram of a hardware command decoder and critical controller.

A block diagram of the preferred hardware command decoder is shown in FIG. 6. Serial data can be received on either channel CDUA 600 or CDUB 604. The equalization signal 602 determines which of the two elements is receiving valid data. Multiplexer 300 determines the proper output, and produces output data as 606. The output data is converted from serial to parallel by converter 302.

The output data is divided by channel numbers as described above, and then detected and error corrected by error detector and corrector module 612, which includes a number of separately-operating modules as described above. The output corrected data 614 is then tested for various things. The virtual channel IO determines whether the data includes any critical control enables. If so, the information is controlled as discussed herein. If no critical enables are contained, however, data is transferred to the 64 bit registers 620 and 622. These double registers buffer the data in a new and advantageous way as described herein.

The output 621 of register 620 and the output 623 of register 622 are connected in parallel to a multiplexer 72. Double buffer controller 306 controls which of the two registers are outputting data.

When a register is full, it begins outputting the data through the multiplexer to the processor. At the same time, the other register should be filling. Each register can hold one-64 bit code block. However, what happens when the data comes in at too fast a rate: i.e., the data comes in so fast that new data arrives before the data in one of the registers has been completely emptied?

According to the present invention, double buffer controller 306 detects new data incoming while an old register is full. Double buffer control 306 then controls the appropriate register to keep only the newer data, and to discard the older data. In this way, if data is to be lost, it is the oldest data that is lost.

More specifically, double buffer controller 306 hence serially reads the data from buffers 76 and outputs the data to multiplexer 72 which transmits the data to the inter subassembly bus interface 20 for transmission over the inter subassembly bus 12 to computer 10. Each data buffer has four 16 bit registers and thus can hold one 64 bit code block 44. At any point in time, one buffer is the active buffer receiving the written data while software is reading data from the other buffer. The assembly 14 also contains a status register 78 which allows software to determine which buffers are full, if the buffers have been overrun, if the receiver is in lock and if any errors have been detected in the data. The assembly 14 can also be programmed to interrupt the host processor whenever it fills a buffer.

Figure 13:
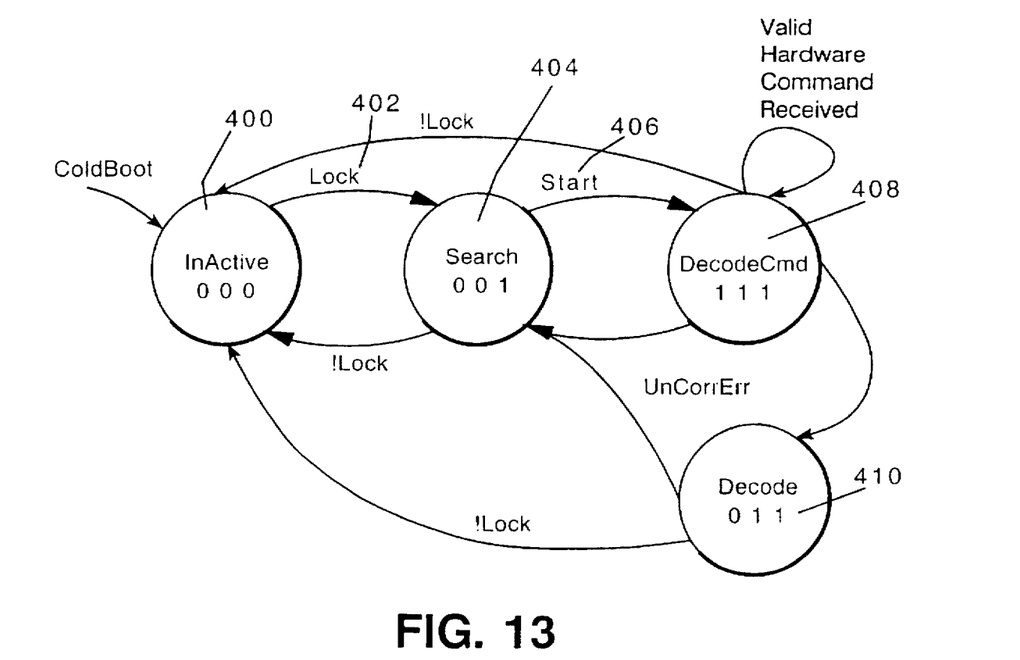
FIG. 13 is a flow diagram of the reception of a critical enable.

Start detection is performed according to the diagram in FIG. 13. The system searches for a lock signal 402 while in the inactive state 400. Once a lock signal 402 has been received, the system transfers to the search state 404. If the lock signal is no longer valid, the system reverts back to the inactive state 400.

The system searches for data in the search state 404. Upon receipt of the data 406, the system transfers to the decode command state 408 where the critical controller checks the data to determine if a critical enable is contained in the data. If a critical enable is contained in the data, the command is decoded 410 by the hardware command decoder 16. If an uncorrectable error is found at any state, the system reverts back to the search state 404. If the lock signal is de-asserted during the decode state 410, the system reverts to the inactive state 400.

The assembly 14 requires very few external support chips to function. Critical control relays 200 are provided external to the assembly 14 so that virtual channel 0 commands can be carried out. The assembly 14 provides only digital outputs with 6 mA drive capability to control the critical enable relays. Therefore, drive circuits for the relays are required. External drivers are not typically required, however, since all of the assembly 14 outputs have 6 mA drivers. Where a large capacitive load is to be driven, however, external buffering may be required. Also, if the start-up PROM 202 is used, PROM chips 202 are preferably provided externally. An external decoder chip is also required to generate the chip selects from the PROMs.

The inter subassembly bus interface 20 connects the assembly 14 to the computer 10 through the inter subassembly bus 12. The inter subassembly bus interface 20 generates all necessary timing sequences so that data can be properly transferred via the intersubassembly bus to the computer 10. The inter subassembly bus interface has two components: an inter subassembly bus slave interface and address decoder. Both of these functions are well known in the art, and off-the-shelf components can be used for carrying this out.

The inter subassembly bus slave interface 20 generates a signal to indicate data as stable on the assembly 14, during read or, as correctly written by the addressed assembly 14 on a write cycle. It also generates coarse grain address range error signals, wherein no chip selects are given, generates a small grain address range error generation signal for undefined address spaces, generates odd data parity on reads, inhibits the stability signal until data parity is stable, and inhibits a write operation if a parity error occurs during a write.

Figure 5:
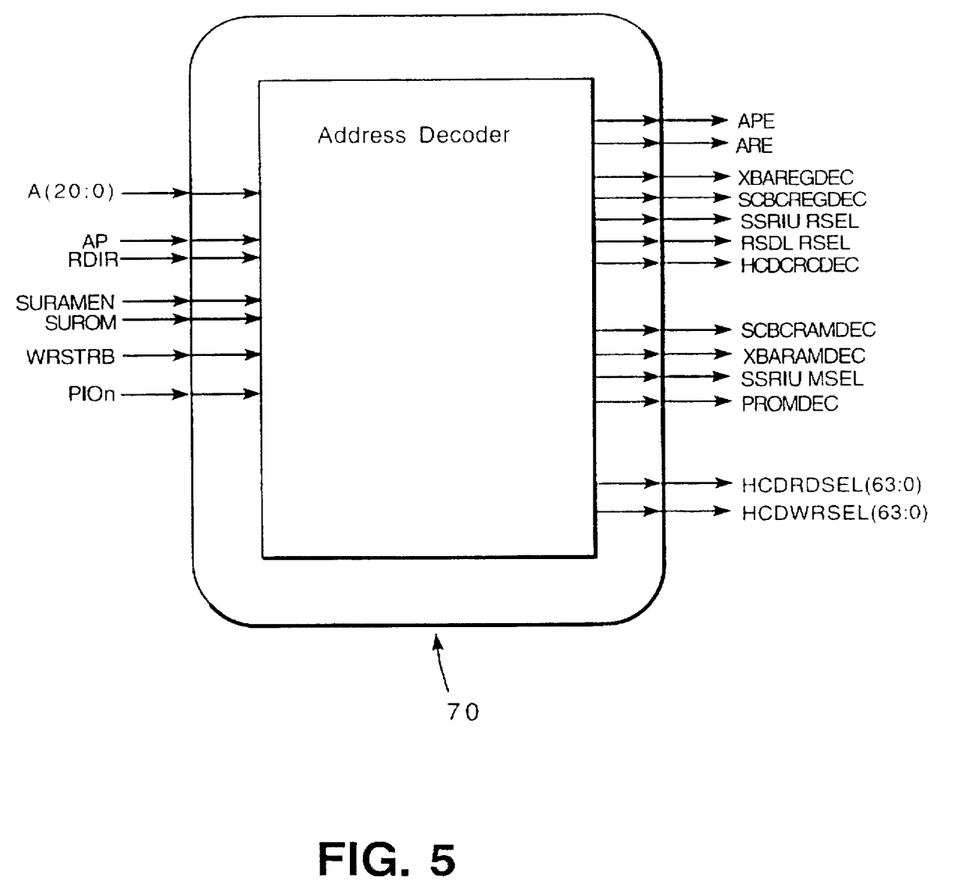
FIG. 5 is a block diagram of an address decoder.

FIG. 5 is a block diagram of an address decoder 70. The address decoder 70 connects directly to the inter subassembly bus interface 20. The address decoder 70 works with the inter subassembly bus interface input bus 74 and generates the decode signals necessary for writing data to any of the Command and Data subsystem ("CDS")hardware. The decodes required for the registers 76 of the assembly 14 are also implemented by this block. CDS chip selects are generated from the inter subassembly bus address bus combinationally, i.e., they are not latched. Chip selects are not given in the event of a course grain address range error or an address parity error.

The address decoder 70 generates various CDS address decodes and internal hardware command decoder/critical controller register selects and write strobes. Inputs to this block are the EFC address, address parity, RDIR, SUROMEn, critical controller bit SUROM and the write strobe from the inter subassembly bus block. All outputs of the address block are combinational decodes of these inputs.

Figure 11:
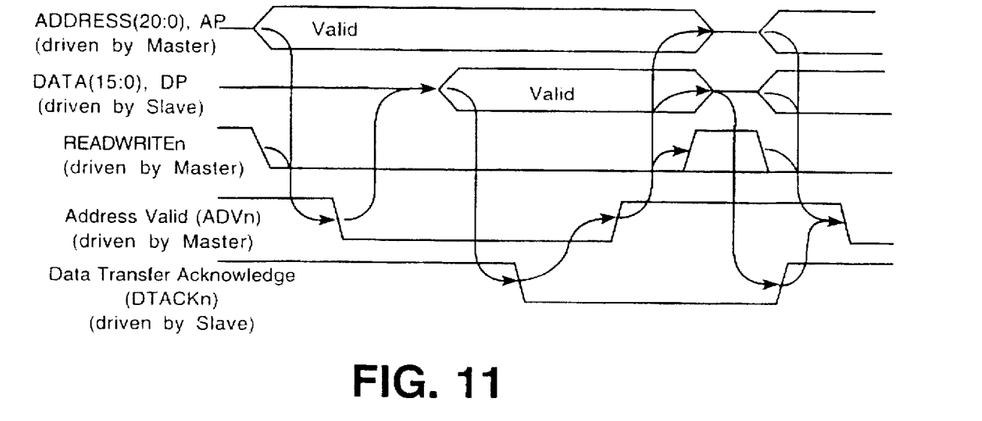
FIG. 11 is a flow diagram of inter subassembly bus interface protocol during a read cycle.
Figure 12:
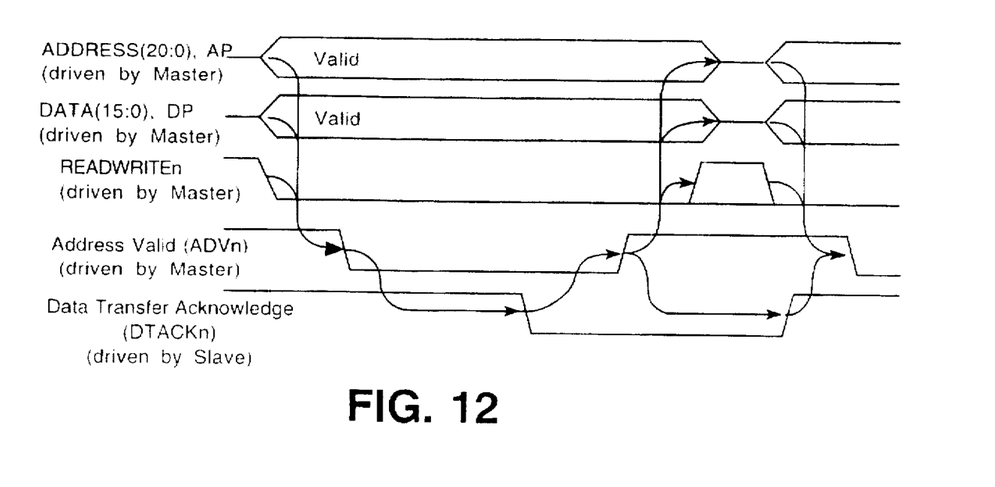
FIG. 12 is a flow diagram of inter subassembly bus interface protocol during a write cycle.

Protocol for the inter subassembly bus interface read cycle is illustrated in FIG. 11 and protocol for the inter subassembly bus interface write cycle is illustrated in FIG. 12.

Figure 9:
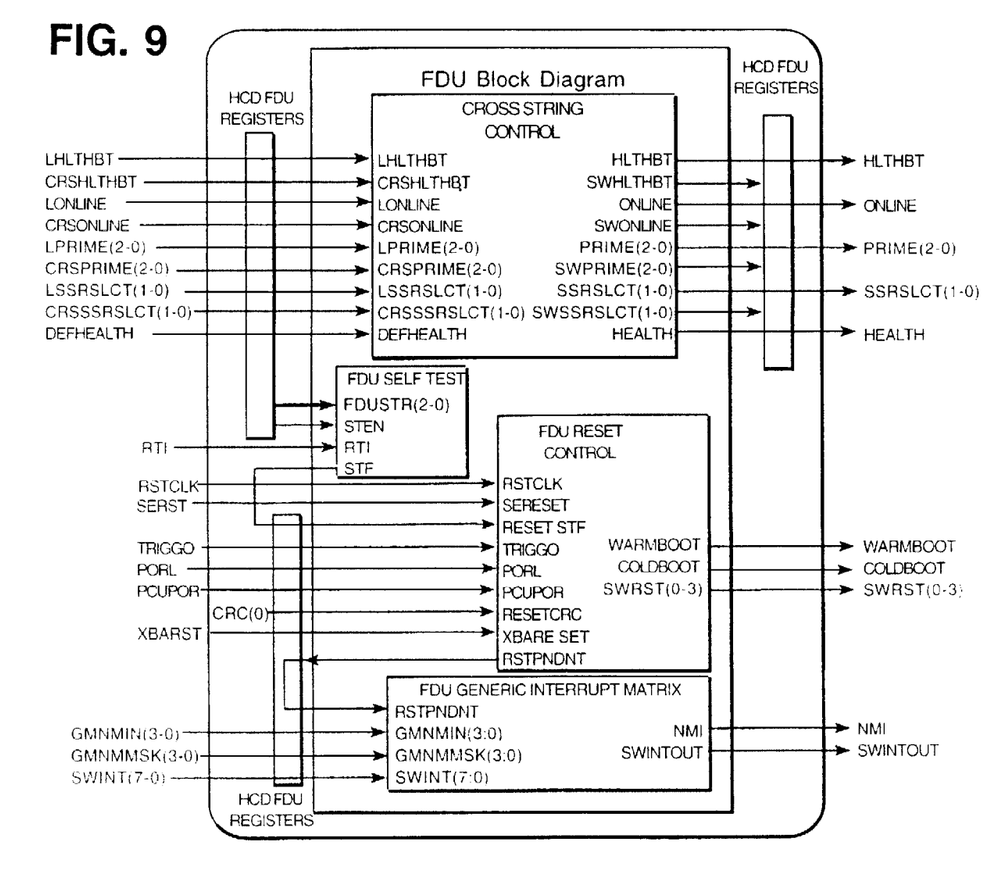
FIG. 9 is a block diagram of a fault detection unit.

The assembly 14 provides a variety of fault detection related functions independent of uplink functions which are often needed in spacecraft data systems. All of these functions operate independently and the user has the option of either using or disabling each function. An example of a fault detection unit is illustrated in FIG. 9.

The fault detection unit provides a sophisticated watchdog timer. Software must write three specific data words to three specific non-contiguous addresses within a fixed amount of time to prevent system reset.

The fault detection unit also provides interrupt control support. Eight input pins are provided which can be connected to generic interrupt sources by the user. The eight inputs are logically ORed together to produce a single interrupt that can be connected to the host processor. Registers are provided which allow software to determine the source of the interrupt, to clear the interrupt, and to individually mask each interrupt source. A reset control is provided which allows up to six different reset sources, three of them definable by the user, each of which will produce a reset of the host subsystem. Eight discrete inputs and eight discrete outputs are provided which support the exchange of system "health" and other information between redundant systems.

The assembly 14 also provides a software interface to start-up PROM. The interface supports up to 64 Kwords (16 bit words) of PROM. The assembly 14 was designed to interface with the Harris HS6617-RH 8kx8 PROM or its equivalent.

Although only a few embodiments have been described in detail above, those having ordinary skill in the art will readily realize that many modifications are possible without departing from the advantageous teaching therein. For example, a hardware embodiment has been described above for carrying out various functions. Many advantages of the present invention are obtained from the hardware operation. However it should be understood by those having ordinary skill in the art that certain of these advantages and functions can also be carried out in software. For example, a special purpose digital signal processor could be appropriately programmed with firmware to carry out the functions of this assembly. It should be understood that these systems are not limited, therefore, to hardware. Other similar modifications would also be apparent to those having ordinary skill in the art, and are intended to be encompassed within the following claims.

What is claimed is:

1. A spacecraft communications system, comprising:
a communication element on the spacecraft for receiving communication;
said element receiving and decoding communications that are in the form of a plurality of frames, each frame including a plurality of code blocks, each code block including a channel number identifier indicating a channel number associated therewith and a package of data associated with the identified channel number, a plurality of code blocks being associated with each said frame; and
a plurality of error detection and correction modules, each error detection and correction module receiving a single code block of the frame, and each code block of the frame being error detected and corrected by said each module in parallel, whereby error detection and correction is carried out in parallel.

2. A system as in claim 1 wherein each error detection and correction unit includes an associated channel number, each channel number of the code block is associated and applied to a predetermined data correction unit having a predetermined number.

3. A system as in claim 2 wherein one of the channel numbers is reserved for a special function other than one of the error detection and correction modules.

4. A system as in claim 3 wherein said reserved channel number is reserved for control of critical control elements.

5. A system as in claim 4 wherein said communication element identifies whether non-critical information is present in the frame.

6. A system as in claim 4 wherein said reserved channel number is the channel numbered zero.

7. A system as in claim 4 wherein the critical control element is for delivery of a payload.

8. A system as in claim 4 further comprising a plurality of latching relays, each latching relay controlling delivery of a specified critical function.

9. A communications system adapted for operation in a space vehicle, comprising:
a first communication on the space vehicle element, receiving a stream of data, and receiving data commanding examination of the data, and searching the data for a reserved start sequence, a first reserved start sequence indicating that non-inverted data is to follow, and a second reserved start sequence that inverted data is to follow;
a receiving element, receiving subsequent data after receiving said start sequence, and either inverting said data or using said data as is depending on which of said first or second start sequence followed;
an error detecting element error detecting said data and correcting said data if less errors than a predetermined amount are found therein;
a buffer structure, holding the error-corrected data, and applying the error-corrected data as a communication to a communication element.

10. A system as in claim 9 wherein said stream of data includes a tail sequence, said tail sequence ending a valid code word by forcing a uncorrectable error.

11. A system as in claim 9 wherein said buffer structure is a double buffer assembly, including two, serially clocked buffer assemblies, each buffer assembly alternately receiving units of computer data, while the computer reads information from the buffer assembly which is not receiving said computer data.

12. A system as in claim 11 wherein said buffers are controlled by a double buffer controller, said double buffer controller including an element for detecting an overrun end data, and which, when overrun is detected, discards oldest data in favor of newly-incoming data.

13. A system as in claim 9 further comprising an identification bit which indicates whether said data is critical data or not, critical data being stored directly in said buffer structure, and non-critical data being processed.

14. A system as in claim 13 wherein said identification is a channel number, which when having a predetermined reserved value indicates that the data is a critical enable, and which when having another of a plurality of unreserved values related to a final destination of said data indicating a non-critical enable.

15. A system as in claim 14 wherein said error detecting element includes a plurality of separate error detection units, each operating in parallel, and each receiving a block of data having a specified channel number.

16. A system as in claim 14 wherein said unreserved values include a channel number indicating which of a plurality of parallel-processed channels the data belongs to.

17. A system as in claim 16 wherein said parallel processing is carried out by the error detecting element unit.

18. A spacecraft communications system, comprising:
a decoding element on the spacecraft, recognizing a predetermined reserved start sequence in a series of data, and decoding subsequent data into a frame of information, said frame of information including a plurality of code blocks, each said code block having identifying information including a channel number;
a critical enable decoder, responsive to a reserved said of one channel numbers, for decoding said channel number and determining if the channel number is one which indicates that the message includes a critical enable command therein;

an instruction buffer receiving contents of the code block; and a further processor, processing the instructions in the buffer to carry out the function commanded by the critical enable if a critical enable is defined therein, and otherwise to pass the instructions to a further processing element, along with the channel number, to decode the instructions.

19. A spacecraft buffering system comprising:

a first element on the spacecraft for receiving a series of uplink commands;

an uplink command data processing device, processing said uplinks command to convert said command into parallel command units;

a first buffer, operating to store a first parallel command unit while said unlink command data processing device is converting said command;

a second buffer, operating to store said parallel command unit while said uplink command;

a double buffering controller, commanding a first buffer to fill while a second buffer is being read out, and including an overrun detection circuit, said overrun detection circuit determining if more data is coming in than can be read out, said overrun detection circuit including a data removal mechanism which removes data that has been overwritten.

* * * * *